(12) United States Patent
Stotz et al.

(10) Patent No.: US 6,188,260 B1
(45) Date of Patent: Feb. 13, 2001

(54) MASTER-SLAVE FLIP-FLOP AND METHOD

(75) Inventors: Dan Stotz; Raymond W Rosenberry, both of Fort Collins, CO (US); Kent R Townley, San Jose, CA (US); Gayvin E Stong, Fort Collins, CO (US)

(73) Assignee: Agilent Technologies, Palo Alto, CA (US)

( * ) Notice: Under 35 U.S.C. 154(b), the term of this patent shall be extended for 0 days.

(21) Appl. No.: 09/235,189

(22) Filed: Jan. 22, 1999

(51) Int. Cl.[7] .................................................. H03K 3/289
(52) U.S. Cl. .............................................................. 327/202
(58) Field of Search ..................................... 327/201, 202, 327/203, 225, 208, 197

(56) References Cited

U.S. PATENT DOCUMENTS

| | | | |
|---|---|---|---|
| 3,539,836 | 11/1970 | Seelbach et al. | 397/202 |
| 3,984,702 | 10/1976 | Fett | 377/80 |
| 4,258,273 | 3/1981 | Straznicky et al. | 377/81 |
| 4,419,762 | 12/1983 | Paul | 377/66 |
| 4,495,629 | 1/1985 | Zasio et al. | 377/70 |
| 5,107,137 | * 4/1992 | Kinugasa et al. | 327/203 |
| 5,264,738 | * 11/1993 | Veendrick et al. | 327/203 |

* cited by examiner

*Primary Examiner*—Toan Tran
*Assistant Examiner*—Hiep Nguyen

(57) ABSTRACT

A master-slave flip-flop and method is provided for use with critical path circuits, for example, driving output pads on an integrated circuit. Briefly described, in architecture, the master-slave flip-flop comprises a master stage and a slave stage. The master stage includes a pass gate, an input inverter coupled to the pass gate, a feedback inverter coupled across the input inverter, and a driving inverter coupled to the output of the input inverter. The output of the driving inverter is coupled to the slave stage which includes a second pass gate through which the output of the driving inverter is applied to the master-slave flip-flop output. The above architecture results in a fast setup time and a fast clock-to-Q time without the problems associated with kickback. Also, the output of the master-slave flip-flop is tristatable.

4 Claims, 4 Drawing Sheets

MASTER-SLAVE FLIP-FLOP AND METHOD

TECHNICAL FIELD

The present invention is generally related to the field of integrated logical circuits and, more particularly, is related to a master-slave flip-flop and associated method.

BACKGROUND OF THE INVENTION

Currently, logical circuits are employed in a nearly infinite number of applications, such as microprocessors and other integrated circuits. In the case of microprocessors, for example, these logical circuits are designed to operate at ever increasing speeds to facilitate the execution of larger and more complex software packages.

The logical circuits may be designed using a multitude of components to accomplish a specific purpose as part of a microprocessor circuit or other integrated circuit. These components may include various logical gates, registers, inverters, amplifiers, or other devices which are created using transistors such as junction field-effect transistors (JFET's) and metal-oxide semiconductor field-effect transistors (MOSFET's) and other circuit elements.

One such logical circuit is called a "master-slave flip-flop" which is often used to capture a specific logical value in a microprocessor or other complex circuit. For example, master-slave flip-flops may be used to capture and store a logical value to be applied to critical path circuits which drive output pads, for example, in a microprocessor or other integrated circuit. The capture of the logical value may be performed according to a clock pulse or other activation signal input.

SUMMARY OF THE INVENTION

The present invention provides a master-slave flip-flop and method for use with critical path circuits, for example, but not limited to, driving output pads on an integrated circuit. Briefly described, in architecture, the master-slave flip-flop comprises a master stage and a slave stage. The master stage includes a pass gate, an input inverter coupled to the pass gate, a feedback inverter coupled across the input inverter, and a driving inverter coupled to the output of the input inverter. The output of the driving inverter is coupled to the slave stage which includes a second pass gate through which the output of the driving inverter is applied to the master-slave flip-flop output.

The present invention can also be viewed as providing a method for maintaining a logical value in a master-slave flip-flop. In this regard, the method can be broadly summarized by the following steps: applying a logical voltage value to an input inverter; maintaining the logical voltage value in the input inverter using a feedback inverter; driving the logical voltage value from the input inverter to a slave stage using a driving inverter; applying the output of the driving inverter to a bus; and, maintaining the logical voltage value on the bus.

The present invention has numerous advantages, a few of which are delineated hereafter. For example, the master-slave flip-flop includes a fast setup time and a fast clock-to-output time (also termed clock-to-Q herein) without the problems associated with charge sharing which may cause loss of state in the master stage due to high capacitance on the output node (also termed kickback herein). Also, the output of the master-slave flip-flop is tristatable. Further, the master-slave flip-flop according to the invention is simple in design, user friendly, robust and reliable in operation, efficient in operation, and easily implemented for mass commercial production.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
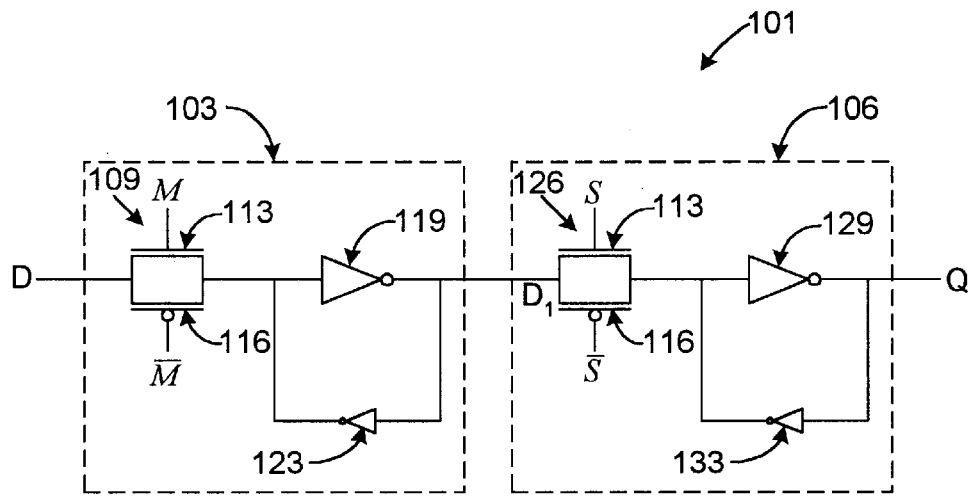
FIG. 1 is a schematic of a first master-slave flip-flop according to the prior art.

Turning to FIG. 1, shown is a prior art master-slave flip-flop (MSFF) 101 having a master stage 103 and a slave stage 106. The master stage includes a first pass gate 109 which may comprise, for example, a single field-effect transistor (FET) or complimentary FETs in parallel, which has an input for a master clock M, an input for an inverted master clock $\overline{M}$, and an input for input data D. The first pass gate 109 comprises an n-type field-effect transistor 113 and a p-type field-effect transistor 116 which are known by those skilled in the art and not described in detail herein. The master stage 103 also includes a master inverter 119 with an input coupled to the output of the first pass gate 109. A master feedback inverter 123 is coupled across the master inverter 119.

The slave stage 106 includes a second pass gate 126 which has an input for a slave clock S, an input for an inverted slave clock $\overline{S}$, and an input for master data $D_1$. The output of the second pass gate 126 is coupled to the input of a slave inverter 129. A slave feedback inverter 133 is coupled across the slave inverter 129. The output Q of the slave inverter 129 is the output of the master-slave flip-flop 101.

The operation of the MSFF 101 is as follows. For purposes of the following discussion, a high voltage is generally a DC voltage level commonly used in the art, such as 3 volts or 5 volts, depending upon the particular application, although it is understood that other voltage levels may be employed as well. The first and second pass gates 109 and 126 act as switches which open when the master and slave clocks M and S, respectively, are set high. To acquire a data bit, the master clock M is set high, thereby applying the input data D to the master inverter 119. If the input data D is applied to the master inverter 119 for a predetermined setup time, the master inverter 119 acquires the input data D and outputs the master data $D_1$ which is the inverse of the input data D. The master feedback inverter 123 receives the data $D_1$ at its input and outputs the value of input data D providing positive feedback to the input of the master inverter 119. When the master clock M is set low once again, then the master feedback inverter 123 ensures that the input to the master inverter 119 remains equal to the input data D acquired by the master inverter 119.

Thereafter, in order to relay the data value to the slave stage 106, the slave clock S is set high which applies the master data $D_1$ to the slave inverter 129 which generates an output Q. The slave feedback inverter 133 receives the output Q at its input and produces the master data $D_1$ which is applied to the input of the slave inverter 129, thereby maintaining the master data $D_1$ at the slave stage 106 after the slave clock S is set low. Thus, the input data D applied to the master stage 103 is ultimately passed through the slave stage 106. The output Q will ultimately be the same data value as the data input D applied to the master stage 103 due to the fact that two consecutive inverters, namely the master and slave inverters 119 and 129, are used. Despite the successful operation of the master-slave flip-flop of FIG. 1, it is not without specific drawbacks as will be discussed.

Figure 2:
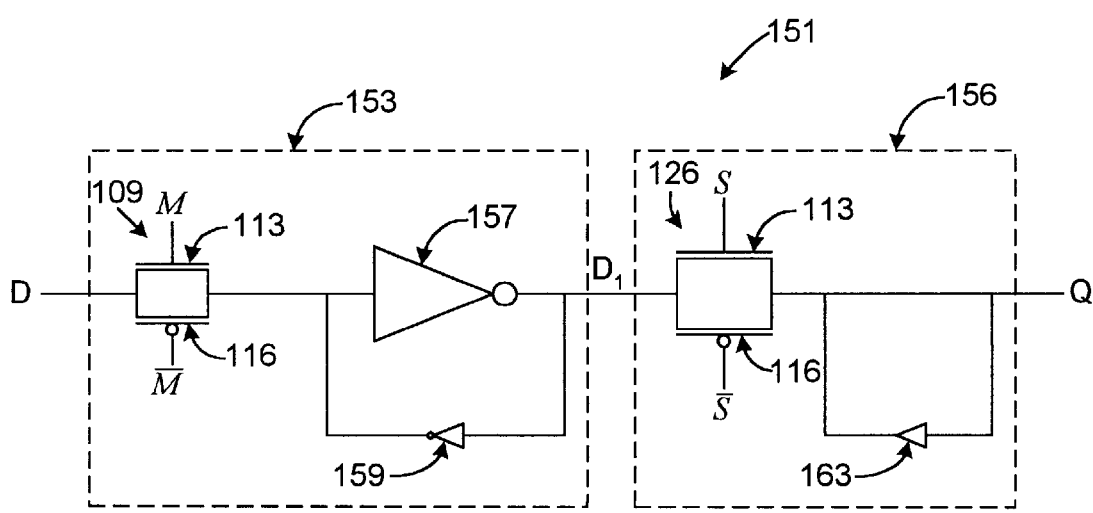
FIG. 2 is a schematic of a second master-slave flip-flop according to the prior art.

Referring next to FIG. 2, shown is a second master-slave flip-flop 151 according to the prior art. The second master-slave flip-flop 151 also includes a master stage 153 and a slave stage 156. The master stage 153 includes a first pass gate 109 and the slave stage 156 includes a second pass gate 126 similar to the master-slave flip-flop 101 (FIG. 1). The master stage 153 also includes a large master inverter 157 with an input coupled to the output of the first pass gate 109. Also, a master feedback inverter 159 is coupled across the large master inverter 157. The slave stage includes a feedback amplifier 163 which is coupled to the output Q (which is inverted in comparison to FIG. 1) in addition to the second pass gate 126.

The operation of the master-slave flip-flop 151 is as follows. To acquire a data bit, the master clock M is set high, thereby applying the input data D to the large master inverter 157. If the input data D is applied to the large master inverter 157 for a predetermined setup time as will be further described herein, the large master inverter 157 acquires the input data D and outputs master data $D_1$ which is the inverse of the input data D. The master feedback inverter 159 receives the data $D_1$ at its input and outputs the input data D. When the master clock M is set low once again, then the master feedback inverter 159 ensures that the input to the large master inverter 157 remains equal to the input data D acquired by the master inverter 157.

Thereafter, in order to relay the data value to the slave stage 156, the slave clock S is set high which applies the master data $D_1$ to the output Q. The slave feedback amplifier 163 receives the output Q at its input and produces output Q, thereby maintaining the master data $D_1$ at the slave stage 156 after the slave clock S is set low. Thus, the input data D applied to the master stage 153 is ultimately passed through the slave stage 156 in an inverted form, although the master-slave flip-flop 151 is not without problems as will be discussed hereinafter.

Figure 3:
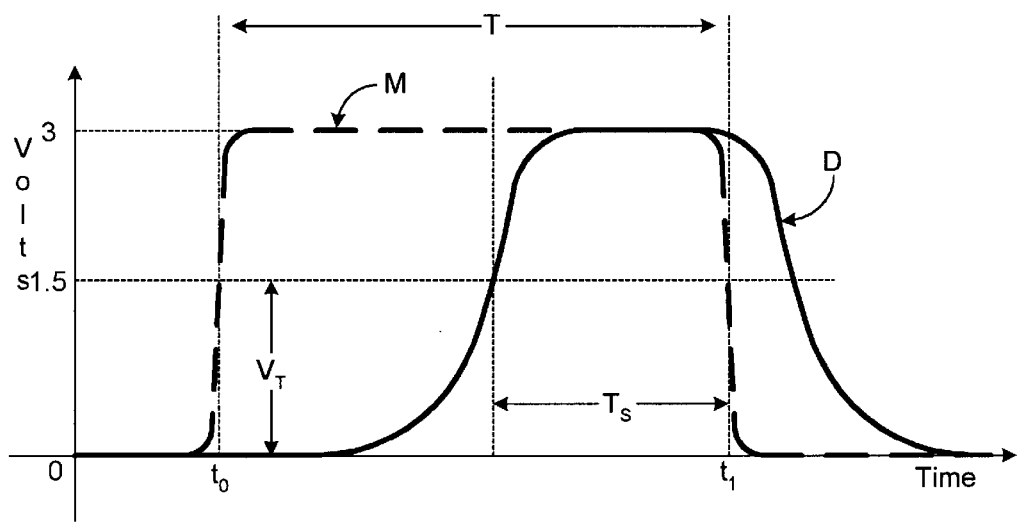
FIG. 3 is a graph illustrating a setup time of a master-slave flip-flop of FIGS. 1 & 2.

Turning then to FIG. 3, shown is a graph which depicts the concept of a setup time necessary for the master stages 103 (FIG. 1) and 153 (FIG. 2) to acquire the data input D (FIGS. 1 and 2). The graph depicts the voltage as a function of time. A master clock M such as the master clock M (FIGS. 1 and 2) comprises a pulse which activates a pass gate 109 (FIGS. 1 and 2) which allows the pass gate 109 to pass the data input D therethrough. The master clock M is set high at time $t_0$ and falls low at time $t_1$. That is to say that at time $t_0$, the master clock M is above a threshold voltage $V_T$ and at time $t_1$, the master clock M falls below the threshold voltage $V_T$. Note the voltage threshold $V_T$ is set at 1.5 volts as shown, although other threshold voltages $V_T$ may be used. The setup time $T_S$ is defined herein as the amount of time that the data input D should be above or below the voltage threshold $V_T$ so that the master stage will acquire the data input D. Thus, the data input D should be in its proper state for the setup time $T_S$ in order to be acquired by the master stage. If the data input D transitions to the proper state too late, then the data input D will not be acquired and an error will result.

Turning back to FIG. 1, the setup time $T_S$ (FIG. 3) for the master-slave flip-flop 101 is generally related to the size of the master inverter 119 and the size of the pass gate 109. In particular, the input capacitance of the master stage 103 is related to the size of the master inverter 119 and the size of the pass gate 109. Also, the input resistance of the master stage 103 is related to the size of the pass gate 109. In addition, the input capacitance and resistance of the master stage 103 are related to factors external to the master-slave flip-flop. Generally, a high input resistance and/or input capacitance results in a longer setup time $T_S$.

Referring once again to FIG. 2, the large master inverter 157 of the second master-slave flip-flop 151 features an increased setup time $T_S$ (FIG. 3) due to its greater size which translates into a larger input capacitance. Thus, the second master-slave flip-flop 151 suffers from a relatively slow setup time $T_S$ as compared to the master-slave flip-flop 101 (FIG. 1) which is a significant disadvantage when faster operation of integrated circuits is desirable.

With reference to FIGS. 1 and 2, another characteristic relative to the master-slave flop flops 101 and 151 is the clock-to-Q time. The clock-to-Q time is defined herein as the time it takes for the output Q to acquire the value $D_1$ from the master stage 103, 153 after the slave clock S goes high. The clock-to-Q time of a particular master-slave flip-flop 101, 151 depends upon the load presented at the output of the master inverter 119, 157 and the capacity of the master inverter 119, 157 to drive the load. Generally, the load driven by the master inverter 119, 157 is a resistive-capacitive (RC) circuit due to the inherent resistance of the pass gate 126 and capacitance of the circuit.

In the case of the master-slave flip-flop 101 of FIG. 1, the master inverter 119 is relatively small which means it has a relatively low driving capacity. When the second pass gate 126 is energized, the slave inverter 129 presents a capacitive load which is charged through the pass gate 126. This capacitance is much less than the capacitance that would be present if the output Q were driven directly as is the case with the master-slave flip-flop 151. Consequently, the master inverter 119 is not overloaded and a relatively quick clock-to-Q time results. However, the use of the slave inverter 129 in the master-slave flip-flop 101 is disadvantageous in that the output Q is not tristatable. That is to say, that the output Q is either high or low and does not include a third high impedance state when the second pass gate 126 is not energized.

With reference to the second master-slave flip-flop 151 of FIG. 2, the relatively large size of the master inverter 157 may facilitate driving a relatively large load at the output Q to achieve a relatively fast clock-to-Q time. Due to the fact that no slave inverter 129 (FIG. 1) is present in the slave stage 156, the output Q is tristatable. That is to say, the output Q can be changed when the second pass gate 126 is idle by another inverter from another master-slave flip-flop 151 or other logical device. However, the benefits of any low clock-to-Q achieved in the second master-slave flip-flop 151 are lost due to the relatively large setup time required by the large master inverter 157. Also, the master-slave flip-flop 151 also includes an additional disadvantage in that charge sharing between a capacitance at the output of the large master inverter 157 and the capacitance of the output Q can cause the state of the master data $D_1$ to switch to the logic value on Q, losing the state of $D_1$. This phenomenon is called "kickback" herein and ultimately may result in an error.

Figure 4:
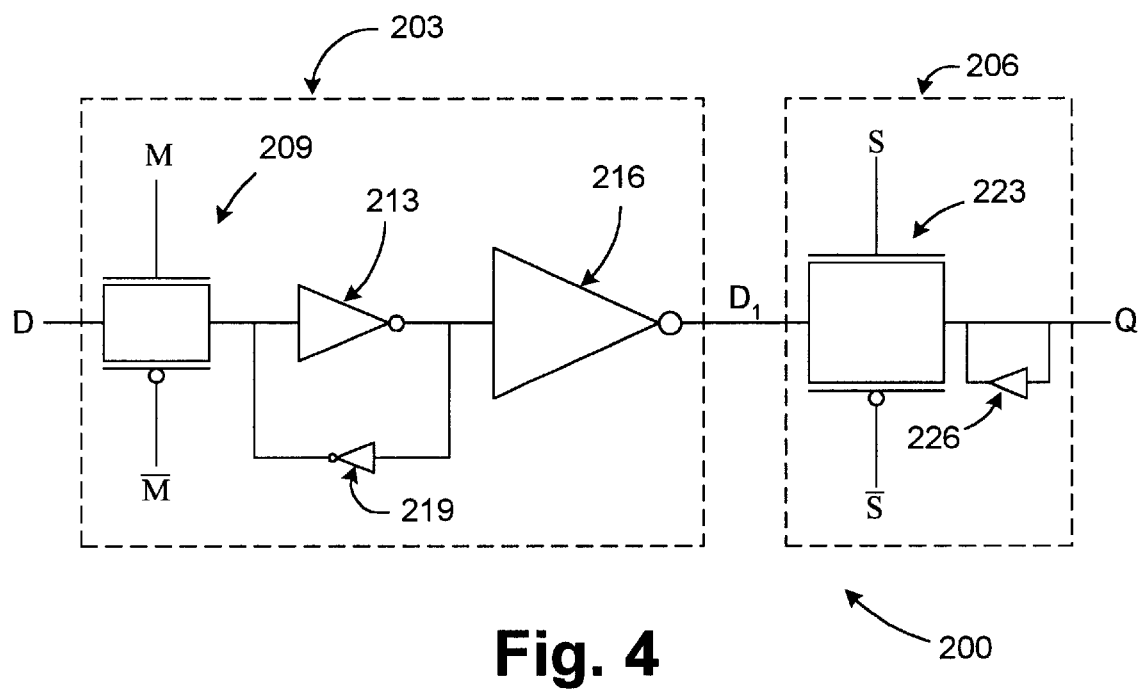
FIG. 4 is a schematic of a master-slave flip-flop according to an embodiment of the present invention.

Turning then, to FIG. 4, shown is a master-slave flip-flop 200 according to an embodiment of the present invention. The master-slave flip-flop 200 includes a master stage 203 and a slave stage 206. The master stage 203 is comprised of a first pass gate 209 having a input for a master clock M and an inverted master clock $\overline{M}$ as well as an input for the data D. The output of the first pass gate 209 is coupled to the input of an input inverter 213. The output of the input inverter 213 is coupled to an input of a driving inverter 216 and to the input of a master feedback inverter 219. The master feedback inverter 219 is coupled across the input inverter 213, where the output of the master feedback inverter 219 is coupled to the input of the input inverter 213.

The output of the driving inverter 216 is coupled to an input of a second pass gate 223 in the slave stage 206. This second pass gate 223 is relatively large in size when compared to the pass gate 209. The output of the second pass gate 223 is also the output Q with both the input and output of a feedback amplifier 226 being coupled to the output Q as shown.

To describe the operation of the master-slave flip-flop 200, the data D is applied to the pass gate 209 and passes through when the master clock M is high. If the data D passes through the pass gate 209 for the required setup time $T_S$ (FIG. 3), the input inverter 213 acquires the data D and outputs the inverse of the data D. This inverse output is applied to the master feedback inverter 219 which outputs the data D and thereby maintains the value of the data D after the master clock M is set low and the pass gate 209 enters a high impedance state.

The output of the input inverter 213 is then applied to the driving inverter 216 which generates the master data $D_1$ at its output. Note that the master data $D_1$ is actually equal to the data D as it was inverted twice. The master data $D_1$ is applied to the second pass gate 223. When the slave clock S is set high, the master data $D_1$ passes through the pass gate 223 and is applied to the output Q. The feedback amplifier 226 acquires the output Q at its input and generates the same at its output to maintain the value of the data at the output Q after the slave clock S is goes low. Note that if the master data $D_1$ conflicts with the previous data held by the feedback amplifier 226, then the driver inverter 216 will override this value due to its relative size as compared to the feedback amplifier 226.

The master-slave flip-flop 200 includes several advantages. First is the relatively fast setup time $T_S$ due to the use of the relatively small input inverter 213. Specifically, the physical parameters of the input inverter 213 include the use of 0.35 micron technology resulting in a setup time $T_S$ of 200 to 250 picoseconds, although the input inverter 213 may be designed with different parameters that achieve a similar fast setup time $T_S$. This allows the data D to be applied late during the pulse in the master clock M (FIG. 3) and still be acquired by the master stage 203.

Also, the driver inverter 216 is relatively large, being approximately four times the size of the input inverter 213, although the driver inverter 216 may be designed with different parameters. The driver inverter 216 advantageously results in a fast clock-to-Q as the relatively large driver inverter 216 can drive a greater load presented by the output Q given the larger size of the pass gate 223. Specifically, the resistance of the RC circuit presented by the driver inverter 216 and the output Q is less due to the larger dimensions of the driver inverter 216 and the large pass gate 223. The driver inverter 216 isolates the output of the input inverter 213 from the output Q as well, preventing the occurrence of the kickback which may result in data error. The faster clock-to-Q provided by the separate driver inverter 216 allows the faster operation of the master-slave flip-flop 200 over prior art designs. Thus, the master-slave flip-flop 200 includes fast setup time $T_S$ and fast clock-to-Q time to achieve an overall increase in operation speed without the occurrence of kickback.

Figure 5:
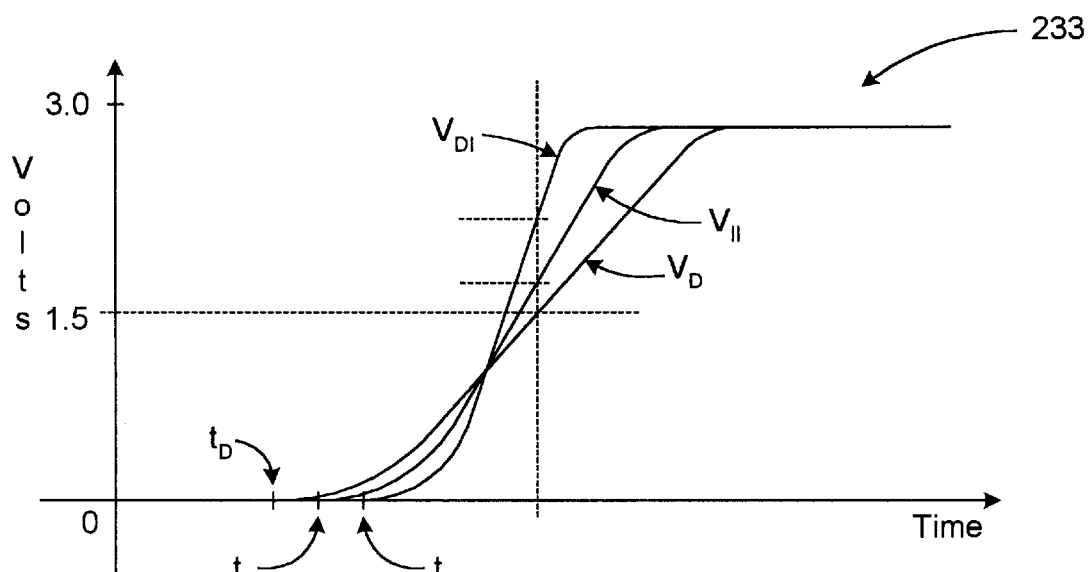
FIG. 5 is a graph illustrating a gain of the master-slave flip-flop of FIG. 4.

With reference to FIG. 5, shown is a graph 233 which shows a gain of the master-slave flip-flop 200. The graph 233 shows the input data voltage $V_D$, the input inverter voltage output $V_{II}$, and the driver voltage output $V_{DI}$, where the input inverter voltage output $V_{II}$ is inverted for purposes of illustration. Specifically, on the graph, a transition of the input data voltage $V_D$ from low to high, which is from 0 Volts to 3 Volts, respectively, begins with the change in the input data voltage $V_D$ at time $t_D$. The input inverter voltage output $V_{II}$ follows at time $t_{II}$ due to a slight delay that occurs by the operation of the input inverter 213 itself. After another delay that occurs due to the operation of the driver inverter 216, the driver voltage output $V_{DI}$ begins to transition at time $t_{DI}$ based upon the output from the input inverter 213.

Note that the rate of change or slew rate of the driver voltage output $V_{DI}$ is higher than the slew rate of the input inverter voltage output $V_{II}$, and, similarly, the slew rate of the input inverter voltage output $V_{II}$, is greater than the input data voltage $V_D$. Even though the reaction of the driver inverter 216 and the input inverter 213 are delayed with respect to the input data D, the higher slew rates of the driver inverter 216 and the input inverter 213 result in a master data $D_1$ that transitions faster than the input data transition itself due to the inherent gain. Thus, the increased speed of the master-slave flip-flop 200 (FIG. 4) is illustrated.

Figure 6:
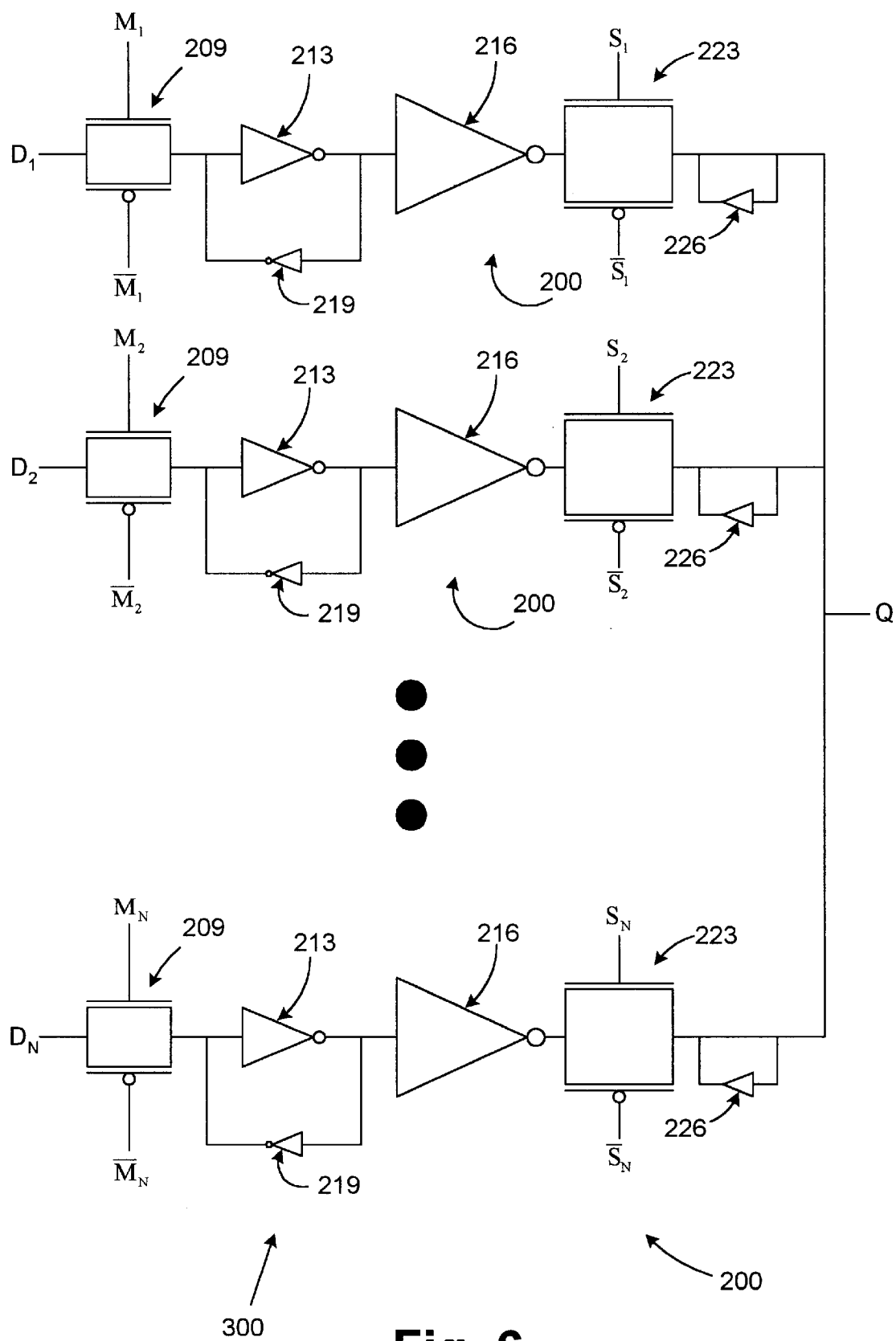
FIG. 6 is a schematic of a tristated group of master-slave flip-flops of FIG. 4.

Finally, turning to FIG. 6, shown is a number N of multiple master-slave flip-flops 200 operating in tandem with a common output Q which forms a tristated group 300 of master-slave flip-flops 200. Thus, the master-slave flip-flop 200 further includes the advantage that the output Q is tristatable as no separate slave inverter 129 (FIG. 1) is employed. Specifically, the driver amplifiers 216 of each master-slave flip-flop 200 can drive the output Q of all the N master-slave flip-flops 200 given that only one of the slave clocks $S_1$, $S_2$, . . . , $S_N$ is set high at a time. The driver amplifiers 216 can advantageously be designed to drive the greater load presented by the common output Q.

Many variations and modifications may be made to the above-described embodiment(s) of the invention without departing substantially from the spirit and principles of the invention. All such modifications and variations are intended to be included herein, within the scope of the present invention.

Therefore, having thus described the invention, at least the following is claimed:

1. A logical circuit comprising;
   at least two master-slave flip-flops, each of the master-slave flip-flops having an output coupled to a common output bus;

each of the master-slave flip-flops comprising:
  a master stage having a first pass gate, an input inverter coupled to the first pass gate, a feedback inverter coupled across the input inverter, and a driving inverter coupled to the output of the input inverter, the driving inverter being larger than the input inverter such that a slew rate of a voltage output of the driving inverter exceeds a slew rate of a voltage output of the input inverter; and
  a slave stage coupled to the output of the driving inverter, the slave stage having a second pass gate coupled to the output of the driving inverter, and, a feedback amplifier coupled to the output of the second pass gate; and
wherein the driving inverter of each master-slave flip-flop is driving the common output bus such that a first one of the master-slave flip-flops is enabled to drive the common output bus provided respective clock signals of all of the other master-slave flip-flops are off.

2. The master-slave flip-flop of claim 1, wherein the driving inverter is larger than the input inverter by a factor of approximately at least four.

3. The master-slave flip-flop of claim 1, wherein the slave stage further comprises:
  a second pass gate coupled to the output of the driving inverter; and
  a feedback amplifier coupled to the output of the second pass gate.

4. The master-slave flip-flop of claim 3, wherein the second pass gate is larger than the first pass gate.

* * * * *